United States Patent
Luschas et al.

(10) Patent No.: US 7,560,983 B1
(45) Date of Patent: Jul. 14, 2009

(54) MULTIPLE-PATH POWER AMPLIFIER

(75) Inventors: Susan Luschas, Sunnyvale, CA (US); Thomas H. Lee, Burlingame, CA (US)

(73) Assignee: ZeroG Wireless, Inc., Sunnyvale, CA (US)

( * ) Notice: Subject to any disclaimer, the term of this patent is extended or adjusted under 35 U.S.C. 154(b) by 0 days.

(21) Appl. No.: 12/025,005

(22) Filed: Feb. 2, 2008

(51) Int. Cl.
*H03F 3/68* (2006.01)

(52) U.S. Cl. .................................. 330/124 R; 330/295

(58) Field of Classification Search ............... 330/53, 330/84, 124 R, 286, 295
See application file for complete search history.

(56) References Cited

U.S. PATENT DOCUMENTS

| | | |
|---|---|---|
| 5,872,481 A | 2/1999 | Sevic et al. |
| 7,382,186 B2 * | 6/2008 | Apel et al. .............. 330/124 R |
| 2004/0108900 A1 * | 6/2004 | Apel .......................... 330/285 |

* cited by examiner

*Primary Examiner*—Khanh V Nguyen
(74) *Attorney, Agent, or Firm*—The Mueller Law Office, P.C.

(57) ABSTRACT

An amplifier circuit and method for amplifying a signal efficiently over a plurality of power ranges. The amplifier circuit including a strong amplifier which is efficient over a first power range and a weak amplifier which is efficient over a second power range. An impedance transformation circuit is used for generating a higher potential and providing increased efficiency when the second range of power is present. A circuit biases active the strong amplifier when the first power range of is present and biases active the weak amplifier when the second power range is present.

17 Claims, 4 Drawing Sheets

MULTIPLE-PATH POWER AMPLIFIER

BACKGROUND OF THE INVENTION

The prevalence of wireless electronic devices has placed increasing constraint on the power performance of electronic circuits. The convenience and utility of battery powered wireless devices are greatly improved through the use of low power circuits. Circuit techniques that preserve power are, therefore, increasingly important in order for these devices to keep in step with higher consumer expectations for convenience and device functionality.

Power amplifier circuits are a significant source of power consumption in wireless devices. One application example where such power consumption is particularly evident is in the transmitter circuit of a wireless device which may employ a power amplifier that boosts a signal for radio transmission. Sufficient power is needed to make an effective radio communication link between the wireless device and its receiver. However, the power required for satisfactory transmission may vary depending on factors such as; the distance between the transmitting and receiving antennas, and the presence of obstacles that may interference with the radio path. The power amplifier must thus be capable of operating over varying power levels or multiple power ranges with the least amount of power consumption so that the wireless device functionality can be extended before the battery needs replacement or recharge. There are other application examples in a wireless device where power amplifiers consume significant power and need to operate over a wide range of power such as a speaker or headphone output. Techniques that reduce the power consumption in power amplifiers are, therefore, important in meeting the consumer's requirements for wireless devices in the competitive market. However, it is difficult to optimize the electrical characteristics of a single amplifier to function over the desired range of power efficiently.

FIG. 1 illustrates an example of a prior art low power wireless system 100 including a low power wireless device 105. The low power wireless device includes a power amplifier 120 to explain one example of the use of a power amplifier using a wireless device transmitter circuit and the importance of reducing the power consumed by power amplifiers. The input of power amplifier 120 is coupled to an output of a remainder of wireless device 110. The input to remainder of wireless device 110 is coupled to the output of a linear amplifier 130. A battery 180 for supplying electrical power is coupled to remainder of wireless device 110, power amplifier 120, and linear amplifier 130. The output of power amplifier 120 and the input of linear amplifier 130 are coupled to a transmit receive switch 160. Transmit receive switch 160 is coupled to an antenna 170 which emits and receives radio communication waves 185 to and from an antenna 190 which is external of low power wireless device 105 and coupled to a wireless device infrastructure 195. Transmit receive switch 160 receives instructions (not shown) from the wireless device.

Examples of low power wireless device 105 include a cell phone, a headset, a computer mouse, or a laptop computer, to name just a few applications. Examples of wireless device infrastructure 195 include a cellular relay tower coupled to a phone network, a television coupled to a broadcast network, a personal computer, and a wireless router connected to the internet. To transmit information from the wireless device, switch 160 closes the switch between power amplifier 120 and antenna 170 while opening the receive path to linear amplifier 130. To receive information, switch 160 opens the switch between power amplifier 120 and antenna 170 while closing the switch to enable the receive path to linear amplifier 130. Radio communication between the wireless device and the wireless device infrastructure enable communication with great user convenience. That convenience ends when battery 180 runs out of charge and needs to be either replaced or recharged. Longer battery lifetime produces higher consumer satisfaction and reduces hazardous waste in the environment. Power amplifier 120 draws a significant amount of power from the battery during transmit operation of the wireless device so it is important to optimize the amplifier's power efficiency.

Many communication systems need to accommodate a wide range of output transmission power levels. For example, good transmission conditions are obtained when radio communication waves 185 have a comparatively short distance to travel, antennas 170 and 190 are in a more direct line of sight, and there are few obstacles in the transmission area that can cause interference. Under these good transmission conditions, there is no need to operate power amplifier 120 with as much power output as in bad transmission conditions. During good transmission conditions, it is desirable to reduce the amplifier's power output to extend the battery lifetime. Thus, power amplifier 120 may be required to operate over a wide range of power output. However, it is generally true that a single conventional power amplifier such as amplifier 120 has a certain range of output power over which its efficiency is high and operation at other power ranges results in worse power efficiency. For example, a conventional single power amplifier that is efficient at high powers will not be as power efficient at low powers.

Each foregoing example is provided by way of explanation of the contextual background of the invention, not limitation of the scope of invention. In fact, it will be apparent to those skilled in the art that modifications and variations can be made in the foregoing examples without departing from the spirit and scope thereof. For instance, the low power wireless device may have coupled to it a plurality of antennas. Also, low power amplifiers that operate over a wide range of power are useful in non-wireless applications such as hearing aids, ear phones, portable instrumentation, and other electronic applications.

One solution to the challenge of optimizing amplifier power efficiency over a wide range of power is to use multiple amplifiers. Several circuits in a cellular communication system using multiple amplifiers are disclosed in U.S. Pat. No. 5,872,481, entitled "Efficient Parallel-Stage Power Amplifier" including; a circuit utilizing an output network connected to each amplifier, and a circuit with two amplifiers that are simultaneously biased in an active state with a switch that shunts one amplifier output to the antenna while shunting the other amplifier output to ground through a load device.

Thus it is desirable to optimize power amplifier efficiency over a wide range of power in order to extend the battery lifetime and functionality of wireless devices.

SUMMARY OF THE INVENTION

The present invention is an amplifier circuit, including; a strong amplifier, a weak amplifier, an impedance transformation circuit, and a control circuit. The strong amplifier has an input node and an output node and is efficient over a first power range. The weaker amplifier is efficient over a second power range and is connected to the input node of the strong amplifier. The second range of power is lower than the first range of power. The impedance transformation circuit is connected to the output of the weaker amplifier. The impedance transformation circuit increases the impedance to generate a higher potential at the output node of the first amplifier and provides increased efficiency over the second power range. The control circuit turns on the strong amplifier when the first power range is present and turns on the weaker amplifier when the second power range is present.

DETAILED DESCRIPTION OF THE EMBODIMENTS

Reference now will be made in detail to embodiments of the disclosed invention, one or more examples of which are illustrated in the accompanying drawings. Each example is provided by way of explanation of the present technology, not limitation of the present technology. In fact, it will be apparent to those skilled in the art that modifications and variations can be made in the present technology without departing from the spirit and scope thereof. For instance, features illustrated or described as part of one embodiment may be used on another embodiment to yield a still further embodiment. Thus, it is intended that the present subject matter covers such modifications and variations as come within the scope of the appended claims and their equivalents.

Figure 1:
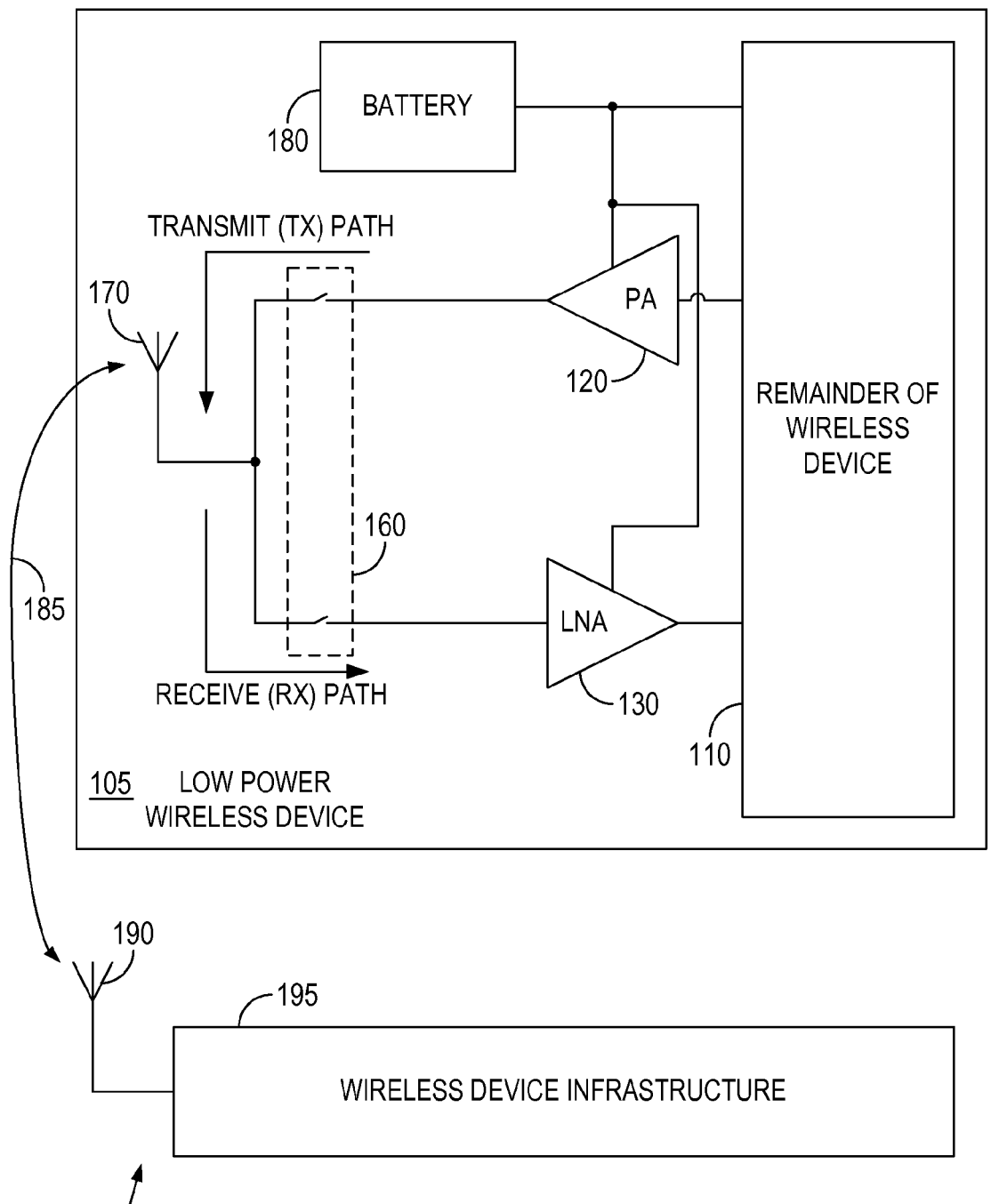
FIG. 1 illustrates a prior art low power wireless system using a power amplifier.
Figure 2:
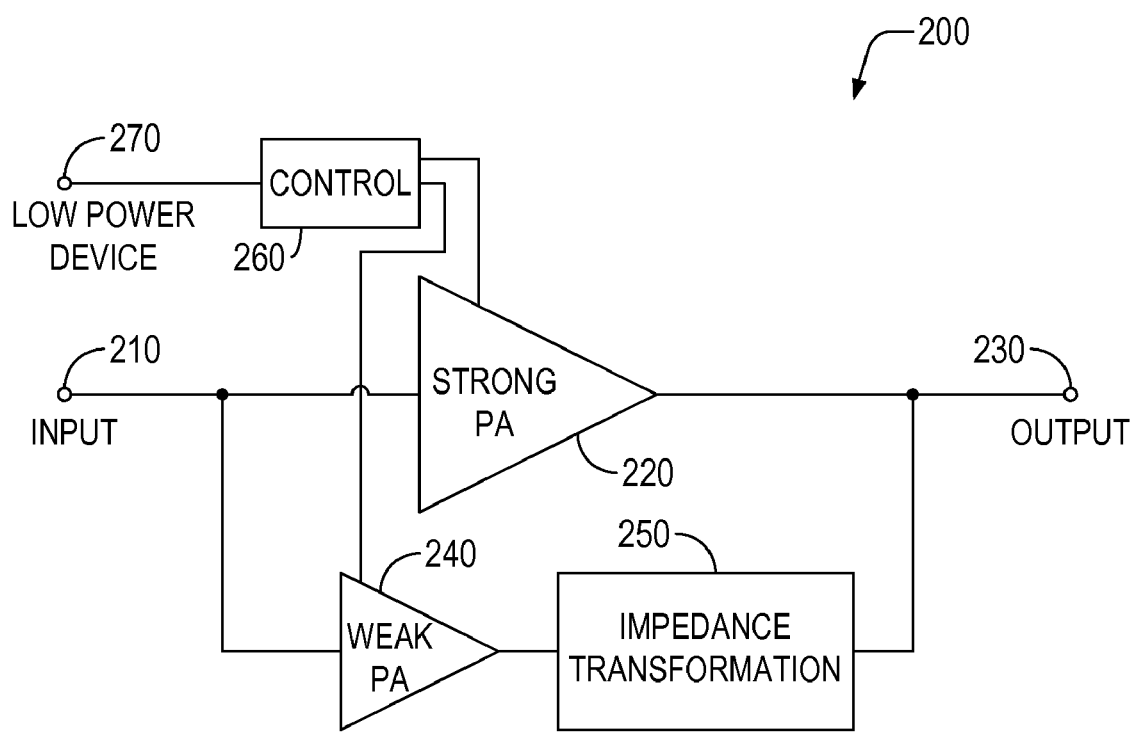
FIG. 2 illustrates a first embodiment of a multiple-path amplifier circuit according to the invention.

The need exists for a simple power amplifier circuit that can operate over a wide range of power with minimized power consumption to extend the lifetime and functionality of the wireless device between power source recharging or replacement. FIG. 2 illustrates a first embodiment of a multiple-path amplifier circuit 200 with reduced power consumption using two power amplifier paths. An input 210 node to the multiple-path amplifier circuit 200 is coupled to the input of a strong power amplifier (PA) 220. Strong power amplifier 220 is most efficient over a certain power range. The output of strong power amplifier 220 is coupled directly to an output 230 node of multiple-path amplifier circuit 200. Input 210 is also coupled to the input of a weak power amplifier 240. Weak power amplifier 240 is most efficient over a lower power range than the certain power range for strong PA 220. The output of weak power amplifier 240 is coupled to an impedance transformation circuit 250. Impedance transformation circuit 250 is coupled to output 230. The input of a control circuit 260 is coupled to a low power device 270. Outputs from control circuit 260 are coupled to both strong power amplifier 220 and weak power amplifier 240.

In this embodiment of the present invention, two or more power amplifiers with corresponding amplifier circuit paths are included, and each path is optimized for power efficiency over a different range of output power. Strong power amplifier 220 is designed to operate most power efficiently at higher power level than weak power amplifier 240. Control circuit 260 is responsive to low power device 270 which determines what power range is to be selected. The input to control circuit 260 may be either digital or analog. If analog, the input to control circuit 260 may be coupled to input 210 within low power device 270 and control circuit 260 extracts the power range information from input 210. Control circuit 260 biases strong power amplifier 220 and weak power amplifier 240 such that just the amplifier and corresponding amplifier circuit path whose characteristics maximize efficiency in the selected power range is activated. As a result, power consumption is reduced in multiple-path amplifier circuit 200.

Amplifier efficiency is a measure of the power delivered to the load (not shown), $P_{LOAD}$, coupled to output 230 of multiple-path amplifier circuit 200, relative to the power consumed from the power supply (battery), $P_{SUPPLY}$. There are two measures of efficiency, drain efficiency and power added efficiency. The drain or collector efficiency, $\eta$, is, $$\eta = P_{LOAD}/P_{SUPPLY} \tag{Eq.1}.$$

The power added efficiency, PAE is, $$PAE = (P_{LOAD} - P_{IN})/P_{SUPPLY} \tag{Eq.2},$$

where $P_{IN}$ is the input signal power delivered to the amplifier. To maximize both measures of efficiency, the power delivered to the load is increased, and the power drawn from the supply is decreased. The power delivered to the load is given by, $$P_{LOAD} = I_{LOAD} V_{LOAD} = P_{DESIRED} \tag{Eq.3},$$

where the power delivered to the load is the system's desired output power, $P_{DESIRED}$. Optimization of this power is at the system level and is beyond the scope of this invention. To maximize efficiency, this invention focuses on reducing $P_{SUPPLY}$ in Equations 1 and 2.

The power delivered at the output of strong PA 220 or weak PA 240, $P_{PA}$, is the power delivered to the load plus, in the case of weak PA 240, any loss in impedance transformation circuit 250, $P_{LOSS}$. The loss in the impedance transformation circuit is typically both low and relatively constant, giving a PA power that is closely related to the load power;

$$P_{PA} = P_{LOAD} + P_{LOSS} \propto P_{LOAD} \propto P_{DESIRED} \tag{Eq.4}.$$

It is desirable to maximize $P_{LOAD}$, and Equation 4 indicates that is closely related to maximizing $P_{PA}$. Furthermore, the power delivered at the output of each power amplifier is the current, $I_{PA}$, times the voltage, $V_{PA}$, at that node given by, $$P_{PA} = I_{PA} V_{PA} \tag{Eq.5}.$$

For example, the $P_{PA}$ for strong amplifier 220 is equal to the current flowing out of output 230 multiplied by the voltage at output 230. The power dissipated from the supply is the supply voltage, $V_{SUPPLY}$, times the supply current, $I_{SUPPLY}$. The supply voltage is typically fixed, whereas the supply current varies with the current supplied by the PA, $I_{PA}$. $I_{PA}$ is typically larger than the current delivered by the supply, by factor k that depends on the power amplifier linearity requirements which results in, $$P_{SUPPLY} = I_{SUPPLY} V_{SUPPLY} = kI_{PA} V_{SUPPLY} \tag{Eq.6}.$$

Equation 6 indicates that to minimize $P_{SUPPLY}$ (to maximize efficiency per Equations 1 and 2), $I_{PA}$ should be minimized. To minimize $I_{PA}$, while maximizing $P_{PA}$, Equation 5 requires maximizing $V_{PA}$.

However, $V_{PA}$ of both strong amplifier 220 and weak amplifier 240 may be limited at their respective output voltages by a constraint, maximum voltage, $V_{MAX}$. $V_{MAX}$ is derived from a critical voltage, $V_{CRIT}$. $V_{CRIT}$ is the voltage at which electrical breakdown effects occur associated with the materials used to make the transistors and dielectric isolations between circuit conductors that may result in higher than desirable currents or other deleterious reliability consequences. Due to manufacturing process variations, $V_{CRIT}$ may vary. It is therefore desirable to constrain the maximum voltage used in the design of the amplifiers (as well as other components) to a maximum operating voltage for reliable operation, $V_{MAX}$, which is safely below $V_{CRIT}$. As semiconductor technologies scale to ever smaller physical dimensions, $V_{MAX}$ gets smaller as well, leaving less headroom for voltage signals in the amplifier. Another limit on $V_{PA}$ is $V_{SUPPLY}$. Thus $V_{PA}$ is limited by the lower of either the device breakdown voltage $V_{MAX}$ or the supply voltage $V_{SUPPLY}$.

Since $V_{PA}$ is limited to a maximum voltage $V_{MAX}$, the current delivered by one of the power amplifiers is, $$I_{PA}=V_{PA}/R_{PA}=V_{MAX}/R_{PA} \quad (\text{Eq.7}),$$

where $R_{PA}$ is the assumed real impedance seen at the output of each power amplifier. This means that the power delivered at the output of each power amplifier from Equations 4, 5, and 7 is, $$P_{PA}=I_{PA}V_{PA}=V^2_{MAX}/R_{PA} \propto P_{LOAD} \propto P_{DESIRED} \quad (\text{Eq.8}).$$

Since $V_{MAX}$ is limited by the supply or process characteristics, Equation 8 results in an optimal choice of $R_{PA}$ for each desired output power level to optimize efficiency. Impedance transformation circuit 250 is used to optimize the value of $R_{PA}$ for lower values of $P_{DESIRED}$ than the $P_{DESIRED}$ used to optimize strong amplifier 220. With $V_{PA}$ held near a constant $V_{MAX}$ to maximize the desired $P_{PA}$, Equation 8 leaves $I_{PA}$ the remaining variable. Thus $I_{PA}$ is primarily used to generate the required wide range of $P_{PA}$ and weak amplifier 240 is designed with lower output current drive, $I_{PA}$, than strong amplifier 220.

The following examples help illustrate the increase in efficiency with optimal choice of $R_{PA}$. Consider a strong power amplifier that delivers $P_{PA}=10$ dBm=10 mW with a $V_{PA}=V_{MAX}$ of 0.707V. Using Equation 8 results in a $R_{PA}=50\Omega$. Using the same strong PA with $R_{PA}=50\Omega$, now instead at a reduced output power of 0 dBm=1 mW results, according to Equation 8, in $V_{PA}=0.224$V which is much less than $V_{MAX}$. The current $I_{PASTRONG}$ is then 4.5 mA and poorly optimized as shown below. Now consider a second example using weak power amplifier 240 that has been designed for a higher $R_{PA}$, provided by impedance transformation circuit 250, that instead keeps $V_{PA}=V_{MAX}$ for the same 0 dBm=1 mW output power level. From Equation 8, the value of $R_{PA}$ is now 505$\Omega$, and the value of $I_{PAWEAK}$ is reduced to 1.4 mA. The value of $P_{SUPPLY}$ from Equation 6 is now reduced by a factor of $I_{PASTRONG}/I_{PAWEAK}=3.2$. This means the drain/collector efficiency of Equation 1 is also increased by a factor of 3.2 when using the weak PA instead of the strong PA in the case of the 0 dBm output power level.

Each of the amplifiers is thus designed to operate most efficiently over its corresponding power range. At a low power range, control circuit 260 enables weak amplifier 240 while disabling strong amplifier 220. Conversely, if a high power range is required, control circuit 260 enables strong amplifier 220 while disabling weak amplifier 240. Thus, activating the most power efficiency optimized amplifier path results in overall greater power efficiency over a wider total power range for multiple-path amplifier 200 than is achievable with a single-path amplifier design.

Another way of describing the function of impedance transformation circuit 250 is it increases the impedance seen by the weak amplifier so that the lower current output from the weak amplifier can still develop a voltage potential at its output approaching that of $V_{MAX}$ to obtain maximum power efficiency per Equation 3. Then the potential (and power) delivered at the load on node output 230 also increases to $V_{MAX}$ less any voltage drop across the impedance transformation circuit, while still efficiently operating weak amplifier 240 under the safe $V_{MAX}$ limit.

The above analysis has been simplified to better explain the invention by ignoring frequency dependent behavior. However, it would be obvious to one skilled in the art that frequency dependent behavior can be incorporated in the above analysis by substituting for R, the appropriate frequency dependant impedance Z and using RMS values for I and V which still leads to the use of impedance transformation circuit 250.

Figure 3:
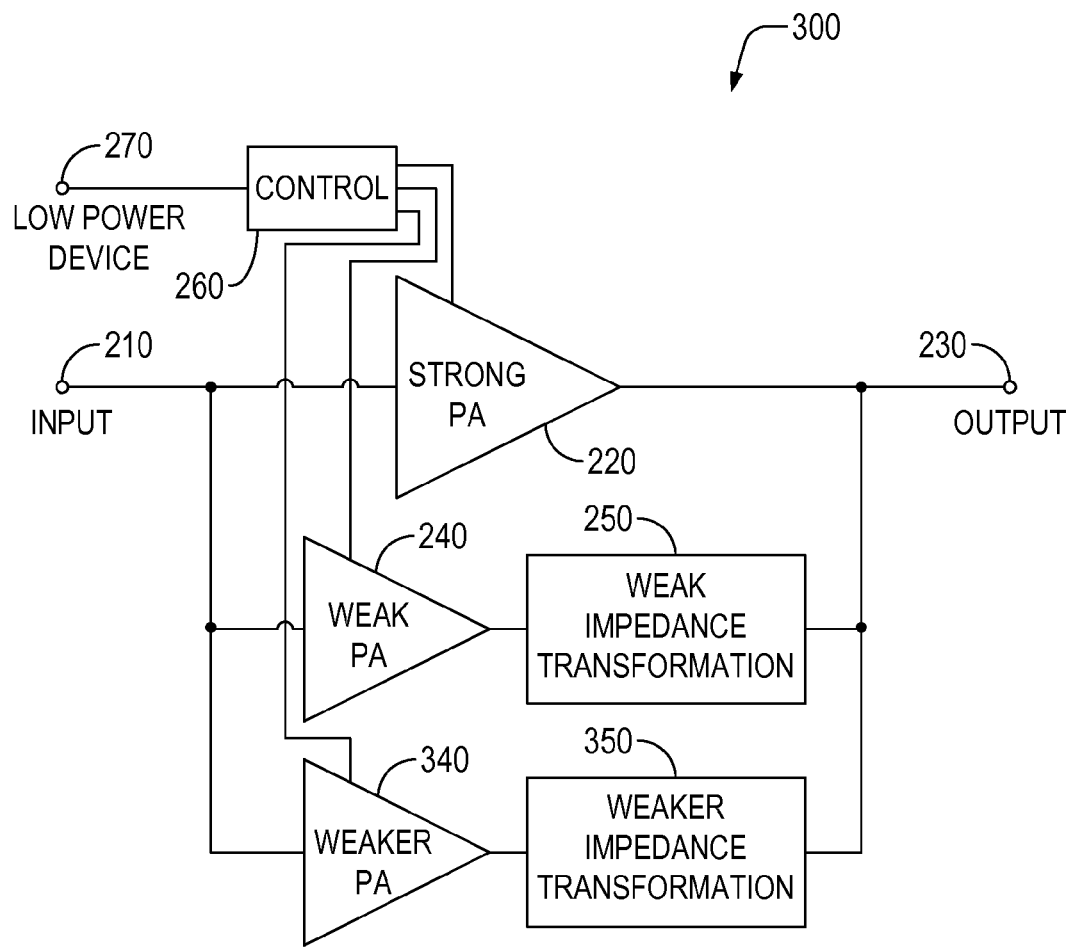
FIG. 3 illustrates a second embodiment of a multiple-path amplifier circuit according to the invention.

Referring to FIG. 3, a second embodiment of a multiple-path amplifier circuit 300 with increased efficiency optimization using three power amplifier paths is illustrated. The same elements of an input 210 node, a strong power amplifier 220, an output 230 node, a weak power amplifier 240, a weak impedance transformation circuit 250, a control circuit 260, and a low power device 270 are shown providing the same interconnection, function, and features as described with reference to FIG. 2. In the circuit provided in FIG. 3, however, a third amplifier circuit path is added using a weaker power amplifier 340, which is optimized for efficient power operation over a third range of power. This third range of power is lower than the power range for weak power amplifier 240. The input 210 is coupled to the input of weaker power amplifier 340. The output of weaker power amplifier 340 is coupled to a weaker impedance transformation circuit 350. Weaker impedance transformation circuit 350 is coupled to output 230. An additional output from control circuit 260 is coupled to weaker power amplifier 340.

Control circuit 260 again activates that amplifier whose characteristics maximize efficiency in the selected range of power. The third power amplifier path and power range in the second embodiment allows further power optimization at the cost of added circuit complexity. Obtaining maximum power efficiently from weaker power amplifier 340 when a third power range is present, is facilitated by weaker impedance transformation circuit 350. The weaker impedance transformation circuit 350 can be analyzed in the same manner as described above in reference to the circuit in FIG. 2. In this second embodiment, weaker power amplifier 340 can supply less output current than weak power amplifier 240 and is optimized to function most efficiently when a third power range lower than the second power range is selected. It should be noted that the total power range of multiple-path amplifier circuit 300 shown in FIG. 3 may be similar to the power range of multiple-path amplifier circuit 200 shown in FIG. 2 or may be wider. If the overall power range is similar, then multiple-path amplifier circuit 300 may provide additional power savings compared with circuit 200.

Extending the principles described above in reference to FIG. 3, a third embodiment may include more amplifier paths to multiple-path amplifier circuit 300 to cover successively lower or narrower power ranges. In this embodiment, each additional amplifier path includes a power amplifier coupled in series to an impedance transformation circuit both optimized for power efficiency when that corresponding power range is selected and that corresponding amplifier is enabled by control circuit 260. An alternative embodiment may share some of the impedance transformation circuits among two or more weak amplifiers. For example, one impedance transformation circuit may be coupled to more than just one weak amplifier when those weak amplifiers are covering adjacent power ranges. Thus, the power efficiency of multiple-path amplifier circuit 300 can be widened to cover a greater range of power or to provide increased power savings compared to circuits with fewer paths. The upper limit on the number of multiple paths is limited by increased complexity, increased hardware, and more load on the strong power amplifier, which reduces its efficiency.

Figure 4:
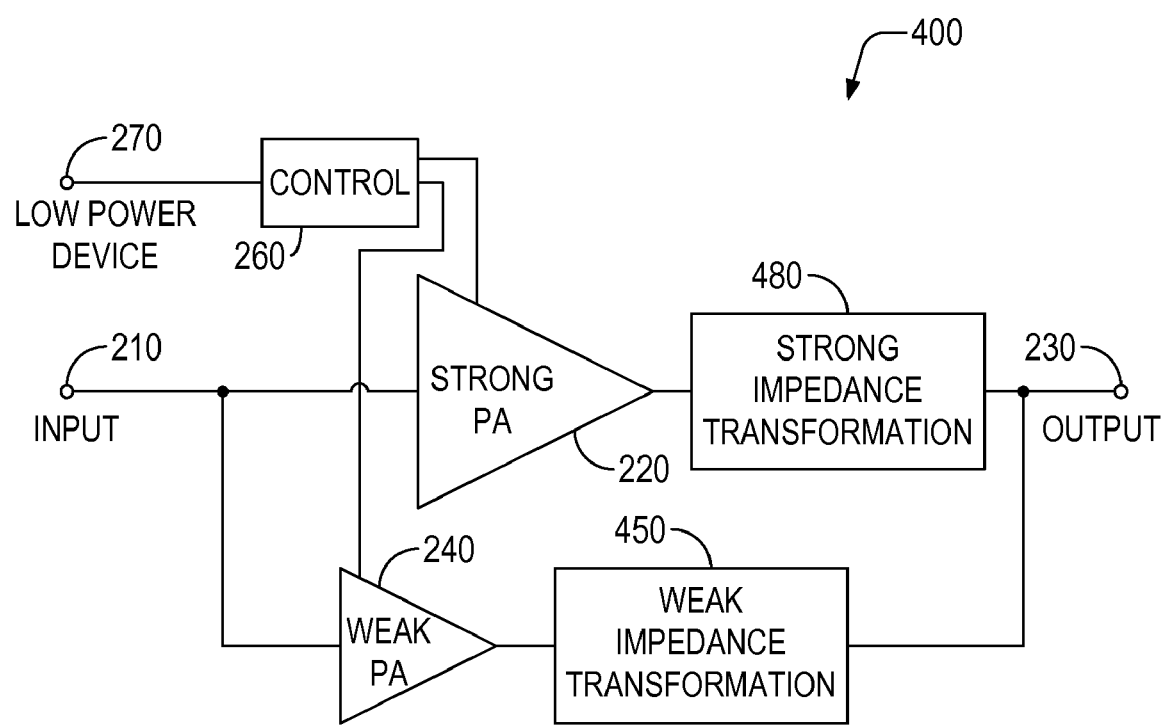
FIG. 4 illustrates a fourth embodiment of a multiple-path amplifier circuit according to the invention.

FIG. 4 illustrates a fourth embodiment of a multiple-path amplifier circuit 400 including two impedance transformation circuits and two power amplifier paths to increase efficiency. The same elements of an input 210 node, a strong power amplifier 220, an output 230 node, a weak power amplifier 240, a control circuit 260, and a low power device 270 are shown providing the same interconnection, function, and features as described with reference to FIG. 2. In the circuit provided in FIG. 4, a strong impedance transformation circuit 480 is added and coupled between the output of strong power amplifier 220 and output 230. A weak impedance transformation circuit 450 is coupled between the output of weak power amplifier 240 and output 230, corresponding to impedance transformation circuit 250 referenced in FIG. 2. The two impedance transformation circuits referenced in FIG. 4 have different values but still function according to the same theory described in reference to FIG. 2. Each impedance transformation circuit referenced in FIG. 4 is optimized to provide added impedance to the output of its corresponding power amplifier when the appropriate power range (amplifier path) is selected. Thus, weak impedance transformation circuit 450 provides higher impedance than strong impedance transformation circuit 480.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the spirit and scope of the present invention, which is more particularly set forth in the appended claims. Furthermore, those of ordinary skill in the art will appreciate that the foregoing description is by way of example only, and is not intended to limit the invention.

What is claimed is:

1. An amplifier circuit, comprising:
   a strong amplifier having an input node and an output node, said strong amplifier being most efficient over a first range of power;
   a weak amplifier coupled to said input node of said strong amplifier, said weak amplifier being most efficient over a second range of power and said second range of power being lower than said first range of power;
   an impedance transformation circuit coupled to said weak amplifier and to said output node of said strong amplifier, said impedance transformation circuit providing increased impedance to generate a higher potential at said output node of said strong amplifier and providing increased efficiency over said second range of power;
   a third weaker amplifier coupled to said input node of said strong amplifier, said third weaker amplifier being most efficient over a third range of power and said third range of power being lower than said second range of power;
   and a second weaker impedance transformation circuit coupled to said third weaker amplifier and to said output node of said strong amplifier, said second weaker impedance transformation circuit providing increased impedance to generate a higher potential at said output node of said strong amplifier and providing increased efficiency over said third range of power; and
   a control circuit biasing said strong amplifier to be activated when said first range of power is present and biasing said weak amplifier to be activated when said second range of power is present.

2. The amplifier circuit of claim 1, wherein said control circuit is coupled to a low power device and said control circuit is responsive to a power range selected by said low power device.

3. The amplifier circuit of claim 1, wherein said control circuit is coupled to said strong and weak amplifiers.

4. The amplifier circuit of claim 1, wherein said weak amplifier supplies less output current than said strong amplifier.

5. The amplifier circuit of claim 1, wherein said control circuit has a digital input.

6. The amplifier circuit of claim 1, wherein said control circuit has an analog input.

7. The amplifier circuit of claim 6, wherein said analog input is coupled to said input node of said strong amplifier.

8. The amplifier circuit of claim 1, wherein said control circuit is coupled to said strong, weak, and third weaker amplifiers and biases said third weaker amplifier to be activated when said third range of power is present.

9. An amplifier circuit having an output node, comprising:
   a strong amplifier having an input node and an output node, said strong amplifier being most efficient over a first range of power;
   a strong impedance transformation circuit coupled to said output node of said strong amplifier and to said output node of said amplifier circuit, said strong impedance transformation circuit providing increased impedance to generate a higher potential at said output node of said amplifier circuit and providing increased efficiency over said first range of power;
   a weak amplifier coupled to said input node of said strong amplifier and having an output node, said weak amplifier being most efficient over a second range of power and said second range of power being lower than said first range of power;
   a weak impedance transformation circuit coupled to said output node of said weak amplifier and to said output node of said amplifier circuit, said weak impedance transformation circuit providing increased impedance to generate a higher potential at said output node of said amplifier circuit and providing increased efficiency over said second range of power;
   a third weaker amplifier coupled to said input node of said strong amplifier and having an output node, said third weaker amplifier being most efficient over a third range of power and said third range of power being lower than said second range of power; and
   a second weaker impedance transformation circuit coupled to said output node of said third weaker amplifier and to said output node of said amplifier circuit, said second weaker impedance transformation circuit providing increased impedance to generate a higher potential at said output node of said amplifier circuit and providing increased efficiency over said third range of power; and
   a control circuit biasing said strong amplifier to be activated when said first range of power is present and biasing said weak amplifier to be activated when said second range of power is present.

10. The amplifier circuit of claim 9, wherein said control circuit is coupled to a low power device, said control circuit is responsive to a power range selected by said low power device, and said control circuit is coupled to said strong and weak amplifiers.

11. The amplifier circuit of claim 9, wherein said control circuit has a digital input.

12. The amplifier circuit of claim 9, wherein said control circuit has an analog input.

13. The amplifier circuit of claim 12, wherein said analog input is coupled to said input node of said strong amplifier.

14. A method for amplifying a signal efficiently over a plurality of power ranges, comprising:
- determining when one of said plurality of power ranges is present;
- activating a strong amplifier when a first range of said plurality of power ranges is present, said strong amplifier having an input node and an output node, said input node carrying said signal, said strong amplifier being most efficient over said first range of power;
- activating a weak amplifier coupled to said input node of said strong amplifier when a second range of said plurality of power ranges is present, said weak amplifier being most efficient over said second range of power, and said second range of power being lower than said first range of power;
- transforming an impedance coupled to said weak amplifier to generate a higher potential at said output node of said strong amplifier to provide increased efficiency when said second range of power is present;
- activating a third weaker amplifier coupled to said input node of said strong amplifier when a third range of said plurality of power ranges is present, said third weaker amplifier being most efficient over said third range of power, and said third range of power being lower than said second range of power; and
- transforming an impedance coupled to said third weaker amplifier to generate a higher potential at said output node of said strong amplifier to provide increased efficiency when said third range of power is present; and
- amplifying said signal efficiently over said plurality of power ranges.

15. The method of claim 14, wherein a low power device is used for determining when one of said plurality of power ranges is present.

16. The method of claim 14, further comprising the step of generating a control signal responsive to said determined power range, said control signal activating said amplifiers.

17. The method of claim 16, wherein a control circuit coupled to said strong and weak amplifiers is used for generating said control signal.

* * * * *